(12) United States Patent
Wang

(10) Patent No.: US 10,992,306 B1
(45) Date of Patent: Apr. 27, 2021

(54) OSCILLATION CIRCUIT AND A SELF-START-UP CONTROL CIRCUIT ADAPTABLE THERETO

(71) Applicant: Himax Technologies Limited, Tainan (TW)

(72) Inventor: Chun Hung Wang, Tainan (TW)

(73) Assignee: Himax Technologies Limited, Tainan (TW)

( * ) Notice: Subject to any disclaimer, the term of this patent is extended or adjusted under 35 U.S.C. 154(b) by 0 days.

(21) Appl. No.: 16/807,005

(22) Filed: Mar. 2, 2020

(51) Int. Cl.
*H03L 7/10* (2006.01)
*H03L 7/099* (2006.01)
*H03L 7/02* (2006.01)
*H03L 3/00* (2006.01)

(52) U.S. Cl.
CPC .............. *H03L 7/105* (2013.01); *H03L 3/00* (2013.01); *H03L 7/02* (2013.01); *H03L 7/099* (2013.01); *H03L 7/0995* (2013.01); *H03L 7/10* (2013.01)

(58) Field of Classification Search
CPC ..... H03L 7/105; H03L 3/00; H03L 7/02; H03L 7/099; H03L 7/0995; H03L 7/10
See application file for complete search history.

(56) References Cited

U.S. PATENT DOCUMENTS

| | | | |
|---|---|---|---|
| 6,114,917 A * | 9/2000 | Nakajima | H03L 7/083 327/158 |
| 6,163,186 A * | 12/2000 | Kurita | G06F 1/10 327/157 |
| 7,323,943 B2 * | 1/2008 | Kaneko | H03L 7/0891 331/12 |
| 7,528,673 B2 * | 5/2009 | Shibuya | H03L 7/02 331/111 |

* cited by examiner

*Primary Examiner* — Ryan Johnson
(74) *Attorney, Agent, or Firm* — Donald E. Stout; Stout, Uxa & Buyan, LLP

(57) ABSTRACT

A self-start-up control circuit adaptable to an oscillation circuit includes a state circuit that generates a reset signal according to a level of a control voltage for a voltage-controlled oscillator (VCO) of the oscillation circuit; and a start-up circuit that starts up the VCO by generating an enable signal according to the reset signal.

17 Claims, 6 Drawing Sheets

OSCILLATION CIRCUIT AND A SELF-START-UP CONTROL CIRCUIT ADAPTABLE THERETO

BACKGROUND OF THE INVENTION

1. Field of the Invention

The present invention generally relates to an oscillator, and more particularly to a self-start-up control circuit adaptable to an oscillation circuit.

2. Description of Related Art

An oscillator is an electronic circuit that produces a periodic oscillating signal, which is mainly used as a basis for coordinating different circuits in an electronic system.

The oscillator, such as voltage-controlled oscillator, may be adopted in an oscillation circuit such as a frequency-locked loop (FLL) circuit or a phase-locked loop (PLL) circuit. The oscillator may on certain occasions fail to oscillate, and some mechanisms are required to start up or wake up the oscillator to resume oscillation.

SUMMARY OF THE INVENTION

In view of the foregoing, it is an object of the embodiment of the present invention to provide a self-start-up control circuit adaptable to an oscillation circuit to self-start up an oscillator of the oscillation circuit.

According to one embodiment, a self-start-up control circuit adaptable to an oscillation circuit includes a state circuit and a start-up circuit. The state circuit generates a reset signal according to a level of a control voltage for a voltage-controlled oscillator (VCO) of the oscillation circuit. The start-up circuit starts up the VCO by generating an enable signal according to the reset signal.

DETAILED DESCRIPTION OF THE INVENTION

Figure 1A:
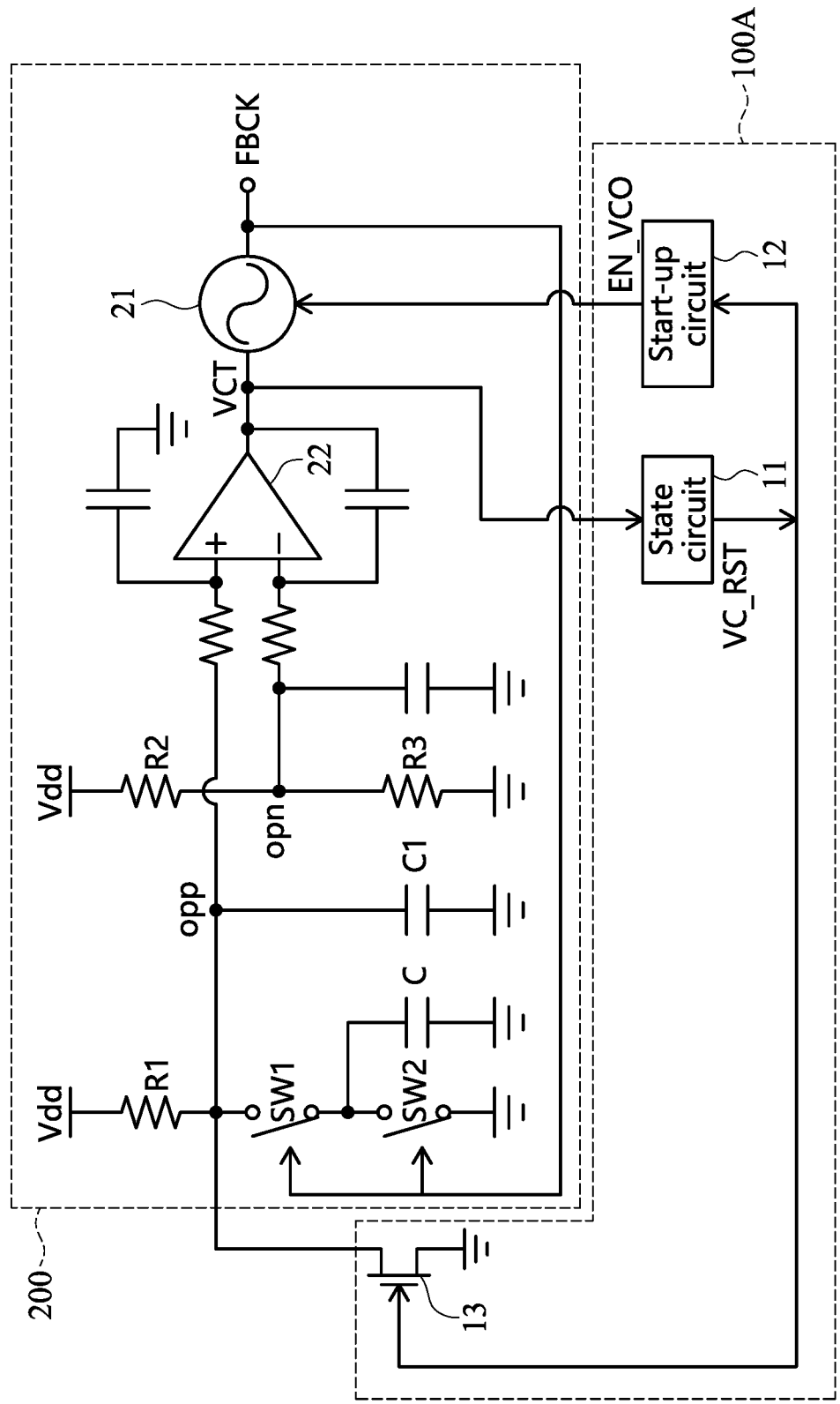
FIG. 1A shows a circuit diagram illustrating a self-start-up control circuit adaptable to a frequency-locked loop (FLL) oscillation circuit according to a first embodiment of the present invention.
Figure 1B:
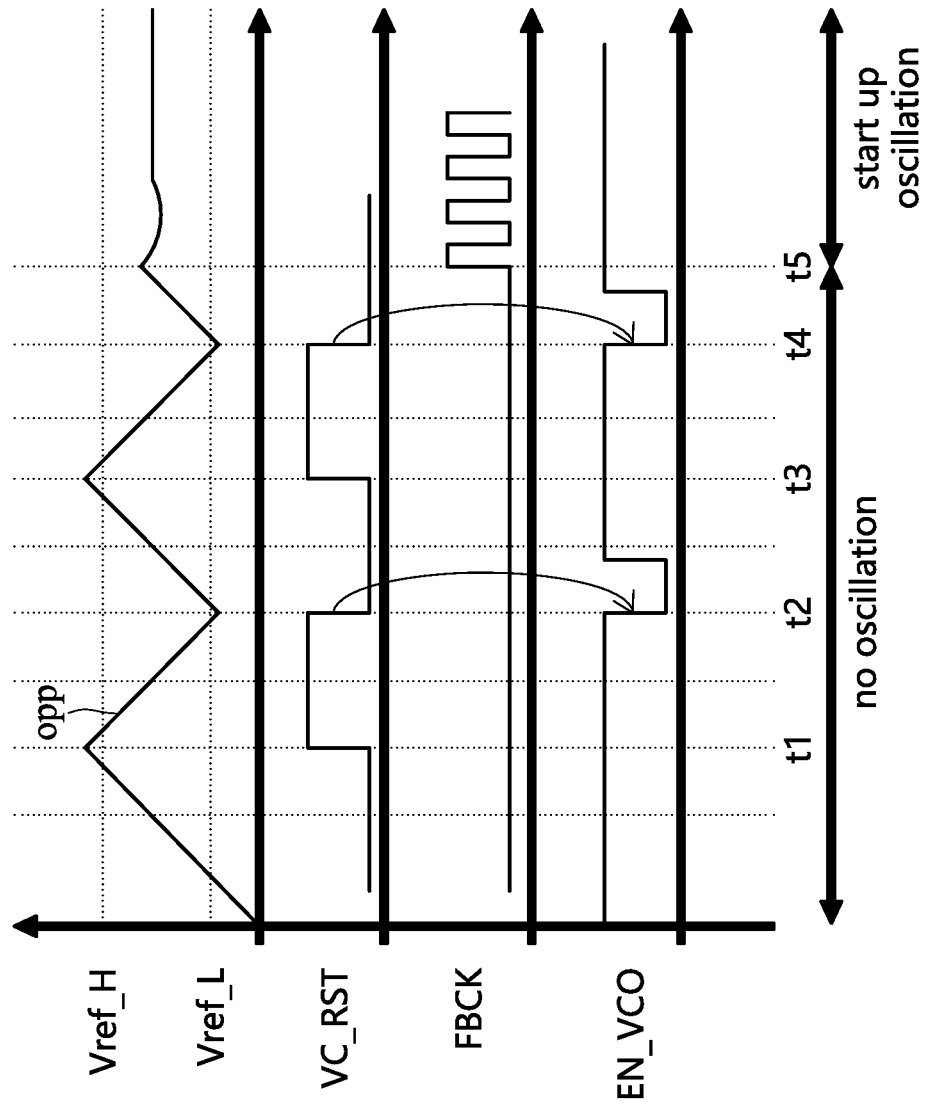
FIG. 1B shows exemplary timing diagrams of pertinent signals of the self-start-up control circuit and the FLL oscillation circuit.

FIG. 1A shows a circuit diagram illustrating a self-start-up control circuit 100A adaptable to a frequency-locked loop (FLL) oscillation circuit 200 according to a first embodiment of the present invention, and FIG. 1B shows exemplary timing diagrams of pertinent signals of the self-start-up control circuit 100A and the FLL oscillation circuit 200.

Specifically, the FLL oscillation circuit 200 may include a voltage-controlled oscillator (VCO) 21 that generates an oscillation output FBCK with an oscillation frequency controlled by or according to a control voltage VCT. The FLL oscillation circuit 200 may include a comparator 22 (e.g., including an operational amplifier and capacitors connected as shown) that generates the control voltage VCT for the VCO 21 by comparing a positive input opp (electrically feeding to a positive input node "+") and a negative input opn (electrically feeding to a negative input node "−"). To be more specific, the node of the positive input opp may be electrically connected to a power voltage Vdd via a first resistor R1, and be electrically connected to ground via a capacitor C1. The node of the positive input opp may be electrically connected to a capacitor C via a first switch SW1, and the capacitor C may be electrically connected to ground via a second switch SW2, where the first switch SW1 and the second switch SW2 are series connected and operate in opposite states (i.e., one switch is on while the other switch is off). The node of the negative input opn may be connected to a voltage divider composed of a second resistor R2 and a third resistor R3 connected as shown.

Figure 2A:
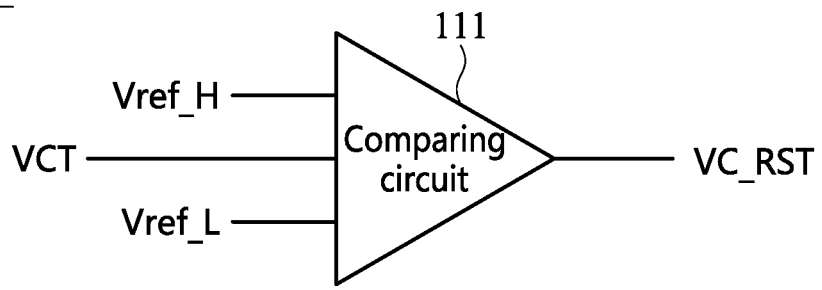
FIG. 2A shows a schematic diagram illustrating the state circuit of FIG. 1A according to one embodiment of the present invention.

In the embodiment, the self-start-up control circuit 100A may include a state circuit 11 configured to determine a state or level of the control voltage VCT to generate a reset signal VC_RST according to the state of the control voltage VCT. Specifically, the reset signal VC_RST may be in a first state (e.g., high) when the control voltage VCT is higher than a predetermined first reference voltage Vref_H, and may be in a second state (e.g., low) when the control voltage VCT is lower than a predetermined second reference voltage Vref_L. FIG. 2A shows a schematic diagram illustrating the state circuit 11 of FIG. 1A according to one embodiment of the present invention. In the embodiment, the state circuit 11 may include a comparing circuit 111 that generates the reset signal VC_RST by comparing the control voltage VCT with the first reference voltage Vref_H and the second reference voltage Vref_L, where the first reference voltage Vref_H is greater than the second reference voltage Vref_L. As exemplified in FIG. 1B, the reset signal VC_RST becomes high (i.e., first state) at time t1 or t3 when the control voltage VCT is higher than the first reference voltage Vref_H, and becomes low (i.e., second state) at time t2 or t4 when the control voltage VCT is lower than the second reference voltage Vref_L. In one embodiment, the comparing circuit 111 may possess hysteresis, as exemplified in FIG. 1B, to prevent unwanted frequent switching.

Figure 2B:
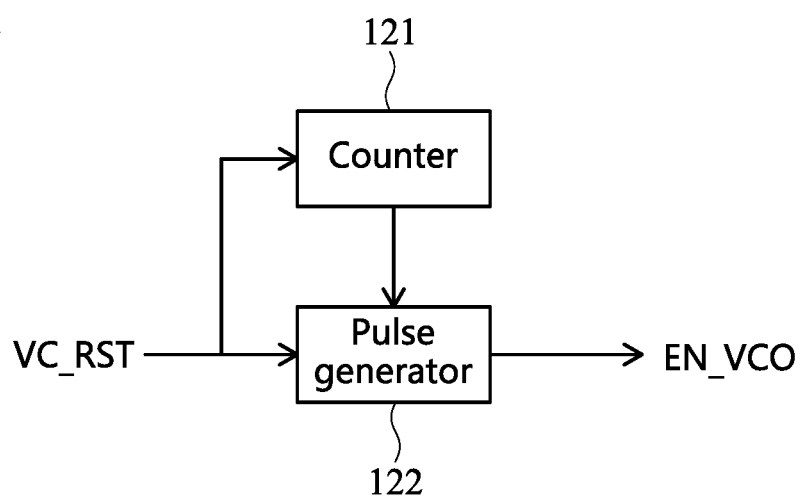
FIG. 2B shows a block diagram illustrating the start-up circuit of FIG. 1A according to one embodiment of the present invention.

The self-start-up control circuit 100A of the embodiment may include a start-up circuit 12 configured to start up the VCO 21 by generating an enable signal EN_VCO according to the reset signal VC_RST. FIG. 2B shows a block diagram illustrating the start-up circuit 12 of FIG. 1A according to one embodiment of the present invention. In the embodiment, the start-up circuit 12 may include a counter 121 configured to store a number of times specific state transition (e.g., from the first state to the second state) of the reset signal VC_RST has occurred. As exemplified in FIG. 1B, at time t2, the counter 121 stores a number "1" indicating the first time the specific state transition from the first state to the second state of the reset signal VC_RST has occurred; and at time t4, the counter 121 stores a number "2" indicating the second time the specific state transition from the first state to the second state of the reset signal VC_RST has occurred.

In the embodiment, the start-up circuit 12 may include a pulse generator 122 configured to generate the enable signal EN_VCO with a predetermined width when the specific state transition (e.g., from the first state to the second state) of the reset signal VC_RST occurs and the stored number of the counter 121 is lower than or equal to a predetermined count. As exemplified in FIG. 1B, the pulse generator 122 generates the enable signal EN_VCO when the reset signal VC_RST transits from the first state to the second state (at time t2 or t4) and the stored number of the counter 121 is lower than or equal to two (i.e., the predetermined count).

Figure 1C:
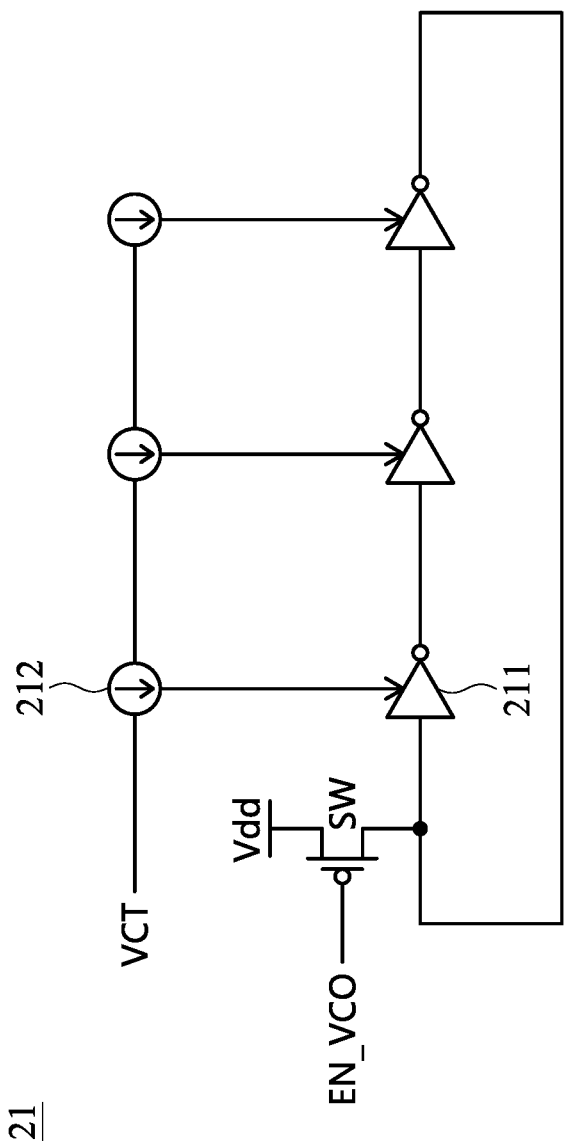
FIG. 1C shows a circuit diagram exemplifying the VCO of FIG. 1A.

FIG. 1C shows a circuit diagram exemplifying the VCO 21 of FIG. 1A. In the embodiment, the VCO 21 may include a plurality of series-connected inverters 211, which may be controlled by current sources 212 respectively under the control voltage VCT. The VCO 21 may include a switch SW composed of a P-type metal-oxide-semiconductor (MOS) transistor having a gate electrode controlled by the enable signal EN_VCO, a source electrode connected to the power voltage Vdd, and a drain electrode connected to an input node of one (e.g., the first one as illustrated) of the inverters 211. When the enable signal EN_VCO becomes low, the input node of the inverter 211 connected to the switch SW is pulled high (e.g., Vdd), thereby enabling the VCO 211 to oscillate.

The self-start-up control circuit 100A of the embodiment may further include a compel switch 13 configured to controllably connecting an inner node of the oscillation circuit (e.g., the FLL oscillation circuit 200 in the embodiment) to ground, thereby lowering the control voltage VCT. In the embodiment, the compel switch 13 may include a metal-oxide-semiconductor (MOS) transistor (e.g., N-type MOS transistor) connected between ground and the node of the positive input opp, and the compel switch 13 may connect the node of the positive input opp to ground when the reset signal VC_RST is in the first state (e.g., high).

In the operation of the self-start-up control circuit 100A in companion with the FLL oscillation circuit 200, no oscillation occurs before time t5. When the control voltage VCT is higher than the first reference voltage Vref_H, the reset signal VC_RST becomes high (in t1-t2 or t3-t4) to turn on the compel switch 13, thereby compellingly discharging the node of the positive input opp to lower the control voltage VCT. Accordingly, lockup of the VCO 21 due to high control voltage VCT may be prevented. As exemplified in FIG. 1B, after the stored number of the counter 121 reaches two (i.e., the predetermined count), the VCO 21 starts up oscillation, at time t5, with stable oscillation output FBCK.

Figure 3:
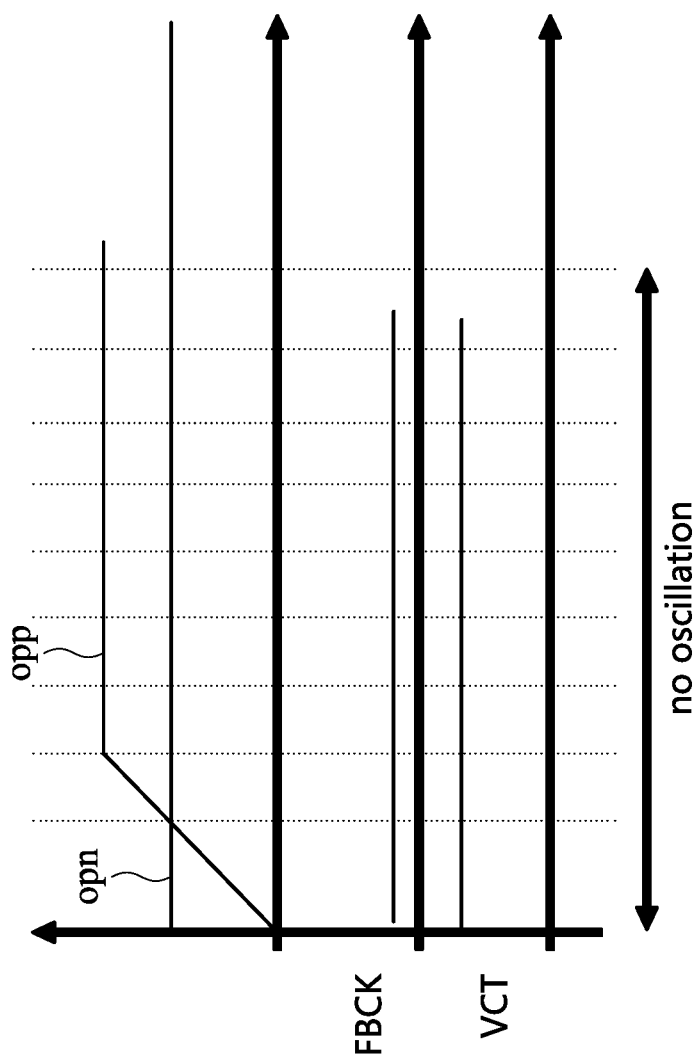
FIG. 3 shows exemplary timing diagrams of pertinent signals of the FLL oscillation circuit without using the self-start-up control circuit.

FIG. 3 shows exemplary timing diagrams of pertinent signals of the FLL oscillation circuit 200 without using the self-start-up control circuit 100A. In this case, the positive input opp and the control voltage VCT remain high, which may lock up the VCO 21 and no oscillation can be outputted. Specifically, the first switch SW1 and the second switch SW2 stop switching as the oscillation output FBCK no longer swings. The capacitor C1 is continuously charged by the power voltage Vdd via the first resistor R1, further increasing the positive input opp and making the lockup of the VCO 21 more severe.

Figure 4:
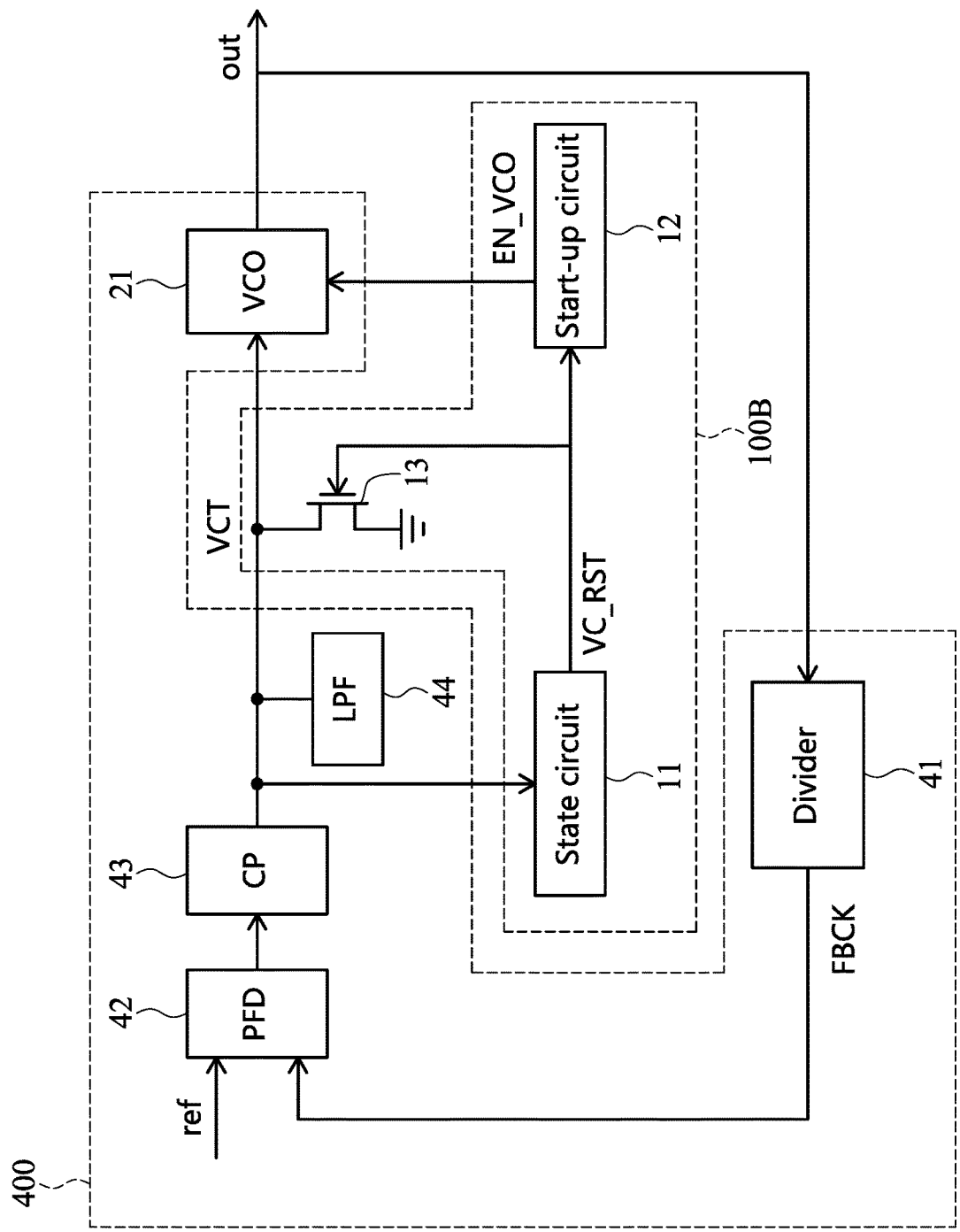
FIG. 4 shows a circuit diagram illustrating a self-start-up control circuit adaptable to a phase-locked loop (PLL) oscillation circuit according to a second embodiment of the present invention.

FIG. 4 shows a circuit diagram illustrating a self-start-up control circuit 100B adaptable to a phase-locked loop (PLL) oscillation circuit 400 according to a second embodiment of the present invention. Specifically, the PLL oscillation circuit 400 may include a voltage-controlled oscillator (VCO) 21 that generates an output signal out with an oscillation frequency controlled by or according to a control voltage VCT. The PLL oscillation circuit 400 may include a divider 41 that divides the oscillation frequency of the output signal out to generate an oscillation output FBCK. The PLL oscillation circuit 400 may include a phase frequency detector (PFD) 42 that compares a reference signal ref and the oscillation output FBCK, a result of which is fed to a charge pump (CP), thereby generating the control voltage VCT for the VCO 21. The PLL oscillation circuit 400 may further include a low-pass filter (LPF) 44 that passes the control voltage VCT with a frequency lower than a predetermined cutoff frequency and attenuates the control voltage VCT with a frequency higher than the cutoff frequency.

In the embodiment, the self-start-up control circuit 100B may include a state circuit 11 configured to determine a state or level of the control voltage VCT to generate a reset signal VC_RST according to the state of the control voltage VCT. The self-start-up control circuit 100B of the embodiment may include a start-up circuit 12 configured to start up the VCO 21 by generating an enable signal EN_VCO according to the reset signal VC_RST. The self-start-up control circuit 100B of the embodiment may further include a compel switch 13 (e.g., N-type MOS transistor) configured to controllably connecting an inner node of the oscillation circuit (e.g., the PLL oscillation circuit 400 in the embodiment) to ground. In the embodiment, the compel switch 13 may connect the node of the control voltage VCT to ground when the reset signal VC_RST is in the first state (e.g., high). The state circuit 11, the start-up circuit 12 and the compel switch 13 of the self-start-up control circuit 100B are similar to counterparts in the self-start-up control circuit 100A, details of which are thus omitted for brevity.

In the operation of the self-start-up control circuit 100B in companion with the PLL oscillation circuit 400, when the frequency of the oscillation output FBCK is higher than the frequency of the reference signal ref, the charge pump 43 performs discharging, thereby lowering the control voltage VCT and the oscillation frequency of the output signal out. When the frequency of the oscillation output FBCK is lower than the frequency of the reference signal ref, the charge pump 43 performs charging, thereby raising the control voltage VCT and the oscillation frequency of the output signal out. When no oscillation occurs from the VCO 21, the charge pump 43 continuously charges to raise the control voltage VCT, which may lock up the VCO 21 and no oscillation can be outputted. The lockup of the VCO 21 due to high control voltage VCT may be prevented and the VCO 21 may be started up by adopting the self-start-up control circuit 100B in a manner similar to self-start-up control circuit 100A as in the previous embodiment.

Although specific embodiments have been illustrated and described, it will be appreciated by those skilled in the art that various modifications may be made without departing from the scope of the present invention, which is intended to be limited solely by the appended claims.

What is claimed is:

1. A self-start-up control circuit adaptable to an oscillation circuit, comprising:

a state circuit that generates a reset signal according to a level of a control voltage for a voltage-controlled oscillator (VCO) of the oscillation circuit; and a start-up circuit that starts up the VCO by generating an enable signal according to the reset signal;

wherein the start-up circuit comprises:

a counter that stores a number of times specific state transition of the reset signal has occurred; and a pulse generator that generates the enable signal with a predetermined width when the stored number of the counter is lower than or equal to a predetermined count.

2. The control circuit of claim 1, wherein the reset signal is in a first state when the control voltage is higher than a predetermined first reference voltage, and is in a second state when the control voltage is lower than a predetermined second reference voltage, wherein the first reference voltage is greater than the second reference voltage.

3. The control circuit of claim 2, wherein the state circuit comprises a comparing circuit that generates the reset signal by comparing the control voltage with the first reference voltage and the second reference voltage.

4. The control circuit of claim 1, wherein the VCO comprises:
   a plurality of series-connected inverters; and
   a switch controlled by the enable signal, the switch being connected between a power voltage and an input node of one of the inverters.

5. The control circuit of claim 1, further comprising:
   a compel switch that controllably connects an inner node of the oscillation circuit to ground, thereby lowering the control voltage.

6. A frequency-locked loop (FLL) oscillation circuit with a self-start-up control circuit, comprising:
   a voltage-controlled oscillator (VCO) that generates an oscillation output with an oscillation frequency controlled by a control voltage;
   a comparator that generates the control voltage by comparing a positive input and a negative input;
   a first resistor, via which a node of the positive input is electrically connected to a power voltage;
   a capacitor;
   a first switch, via which the node of the positive input is electrically connected to the capacitor;
   a second switch, via which the capacitor is electrically connected to ground, where the first switch and the second switch are series connected and operate in opposite states; and
   a voltage divider composed of a second resistor and a third resistor to provide a voltage to a node of the negative input;
   wherein the control circuit comprises:
      a state circuit that generates a reset signal according to a level of the control voltage; and
      a start-up circuit that starts up the VCO by generating an enable signal according to the reset signal.

7. The FLL oscillation circuit of claim 6, wherein the reset signal is in a first state when the control voltage is higher than a predetermined first reference voltage, and is in a second state when the control voltage is lower than a predetermined second reference voltage, wherein the first reference voltage is greater than the second reference voltage.

8. The FLL oscillation circuit of claim 7, wherein the state circuit comprises a comparing circuit that generates the reset signal by comparing the control voltage with the first reference voltage and the second reference voltage.

9. The FLL oscillation circuit of claim 6, wherein the start-up circuit comprises:
   a counter that stores a number of times specific state transition of the reset signal has occurred; and
   a pulse generator that generates the enable signal with a predetermined width when the stored number of the counter is lower than or equal to a predetermined count.

10. The FLL oscillation circuit of claim 6, wherein the VCO comprises:
    a plurality of series-connected inverters; and
    a switch controlled by the enable signal, the switch being connected between a power voltage and an input node of one of the inverters.

11. The FLL oscillation circuit of claim 6, wherein the control circuit further comprises:
    a compel switch that controllably connects a node of the positive input to ground, thereby lowering the control voltage.

12. A phase-locked loop (PLL) oscillation circuit with a self-start-up control circuit, comprising:
    a voltage-controlled oscillator (VCO) that generates an output signal with an oscillation frequency controlled by a control voltage;
    a divider that divides the oscillation frequency of the output signal to generate an oscillation output;
    a phase frequency detector (PFD) that compares a reference signal and the oscillation output; and
    a charge pump that receives a result of the PFD, thereby generating the control voltage;
    wherein the control circuit comprises:
       a state circuit that generates a reset signal according to a level of the control voltage; and
       a start-up circuit that starts up the VCO by generating an enable signal according to the reset signal;
    wherein the start-up circuit comprises:
       a counter that stores a number of times specific state transition of the reset signal has occurred; and
       a pulse generator that generates the enable signal with a predetermined width when the stored number of the counter is lower than or equal to a predetermined count.

13. The PLL oscillation circuit of claim 12, further comprising:
    a low-pass filter that passes the control voltage with a frequency lower than a predetermined cutoff frequency and attenuates the control voltage with a frequency higher than the cutoff frequency.

14. The PLL oscillation circuit of claim 12, wherein the reset signal is in a first state when the control voltage is higher than a predetermined first reference voltage, and is in a second state when the control voltage is lower than a predetermined second reference voltage, wherein the first reference voltage is greater than the second reference voltage.

15. The PLL oscillation circuit of claim 14, wherein the state circuit comprises a comparing circuit that generates the reset signal by comparing the control voltage with the first reference voltage and the second reference voltage.

16. The PLL oscillation circuit of claim 12, wherein the VCO comprises:
    a plurality of series-connected inverters; and
    a switch controlled by the enable signal, the switch being connected between a power voltage and an input node of one of the inverters.

17. The PLL oscillation circuit of claim 12, wherein the control circuit further comprises:
    a compel switch that controllably connects a node of the control voltage to ground.

* * * * *